(12) United States Patent
Abel

(10) Patent No.: US 10,019,980 B1
(45) Date of Patent: *Jul. 10, 2018

(54) DISTORTION AND PITCH PROCESSING USING A MODAL REVERBERATOR ARCHITECTURE

(71) Applicant: Jonathan Abel, Menlo Park, CA (US)

(72) Inventor: Jonathan Abel, Menlo Park, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/201,013

(22) Filed: Jul. 1, 2016

Related U.S. Application Data

(60) Provisional application No. 62/188,299, filed on Jul. 2, 2015.

(51) Int. Cl.
| | |
|---|---|
| *H03G 3/00* | (2006.01) |
| *G10K 15/12* | (2006.01) |
| *G01R 23/00* | (2006.01) |
| *G10H 1/36* | (2006.01) |
| *H03H 17/02* | (2006.01) |
| *G10H 5/00* | (2006.01) |

(Continued)

(52) U.S. Cl.
CPC .............. *G10K 15/12* (2013.01); *G01R 23/00* (2013.01); *G10H 1/125* (2013.01); *G10H 1/366* (2013.01); *G10H 5/007* (2013.01); *G10H 5/02* (2013.01); *H03H 17/02* (2013.01)

(58) Field of Classification Search
CPC ........ G10K 15/12; G10H 5/007; G10H 1/125; G10H 1/366; G10H 5/02; G01R 23/00; H03H 17/02; H03G 3/00; G10G 7/02
USPC .............. 381/63; 84/622, 661, 654; 708/320
See application file for complete search history.

(56) References Cited

U.S. PATENT DOCUMENTS

| | | | |
|---|---|---|---|
| 2,230,836 A | | 2/1941 | Hamnnond |
| 4,099,027 A | * | 7/1978 | Whitten ................... H04K 1/06 327/277 |

(Continued)

OTHER PUBLICATIONS

Abel et al., "Luciverb: Iterated Convolution for the Impatient," Audio Engineering Society Convention 133, Oct. 2012, pp. 1-10.

(Continued)

*Primary Examiner* — Vivian Chin
*Assistant Examiner* — Ubachukwu Odunukwe
(74) *Attorney, Agent, or Firm* — Foley & Lardner LLP; Mark J. Danielson

(57) ABSTRACT

A reverberator based on a room response modal analysis is adapted to produce distortion, pitch and time manipulation effects, as well as gated and iterated reverberation. An example "modal reverberator" is a parallel collection of resonant filters, with resonance frequencies and dampings tuned to the modal frequencies and decay times of the space or object being simulated. In one example, the resonant filters are implemented as cascades of heterodyning, smoothing, and modulation steps, forming a type of analysis/synthesis architecture. By applying memoryless nonlinearities to the modulating sinusoids, distortion effects are produced, including distortion without intermodulation products. By using different frequencies for the heterodyning and associated modulation operations, pitch manipulation effects are generated, including pitch shifting and spectral "inversion." By resampling the smoothing filter output, the signal time axis is stretched without introducing pitch changes.

31 Claims, 14 Drawing Sheets

(51) Int. Cl.
*G10H 1/12* (2006.01)
*G10H 5/02* (2006.01)

(56) References Cited

U.S. PATENT DOCUMENTS

| | | | | |
|---|---|---|---|---|
| 5,491,754 | A * | 2/1996 | Jot | H04S 7/305 381/63 |
| 5,502,747 | A | 3/1996 | McGrath | |
| 5,748,513 | A * | 5/1998 | Van Duyne | B29C 65/7873 708/320 |
| 6,284,965 | B1 * | 9/2001 | Smith, III | G10H 1/125 84/622 |
| 2009/0052682 | A1 * | 2/2009 | Kuroiwa | G10K 15/02 381/63 |
| 2010/0144306 | A1 * | 6/2010 | Karr | G08B 27/00 455/404.1 |
| 2011/0064235 | A1 * | 3/2011 | Allston | G10H 1/366 381/63 |
| 2011/0305347 | A1 * | 12/2011 | Wurm | G10K 11/178 381/71.1 |
| 2012/0011990 | A1 * | 1/2012 | Mann | G10D 17/00 84/742 |
| 2013/0202125 | A1 | 8/2013 | De Sena et al. | |

OTHER PUBLICATIONS

Della Pietra et al., "On the Dynamic Behavior of Axially Excited Helical Springs," MECCANICA, vol. 17, pp. 31-43, 1982.
Fletcher et al., "The Physics of Musical Instruments," 2nd ed., Springer, 2010, pp. 128-130.
Garcia, "Optimal Filter Partition for Efficient Convolution with Short Input/output Delay," Audio Engineering Society Convention 113, Oct. 2002, pp. 1-9.
Gardner, "Efficient Convolution without Input-Output Delay," J. Audio Eng. Soc., vol. 43, No. 3, pp. 127-136, 1995.
Jot, "Digital Delay Networks for Designing Artificial Reverberators," in Audio Engineering Society Convention 90, Feb. 1991, pp. 1-17.
Karjalainen et al., "More about this reverberation science: Perceptually good late reverberation." Audio Engineering Society (2001).
Lee et al., "A Reverberator with Two-Stage Decay and Onset Time controls," Audio Engineering society Convention 129, preprint No. 8208, Nov. 2010, pp. 1-6.
Matthews et al., "Methods for Synthesizing Very High {Q} Parametrically Well Behaved Two Pole Filters," Proc. Swedish Musical Acoustics Conference, Aug. 2003, pp. 1-4.
Meinema et al., "A New Reverberation Device for High Fidelity Systems," J. Audio Eng. Soc., vol. 9, No. 4, pp. 284-289, 324-326, 1961.
Morse et al., "Theoretical Acoustics", Princeton University Press, 1987, pp. 467-607.
Schroeder, "Natural Sounding Artificial Reverberation," Audio Engineering Society Convention 13, Oct. 1961, pp. 1-18.
Vallmaki et a., "Fifty Years of Artificial Reverberation," IEEE Transactions on Audio, Speech, and Language Processing, vol. 20, No. 5, pp. 1421-1448, Jul. 2012.

* cited by examiner

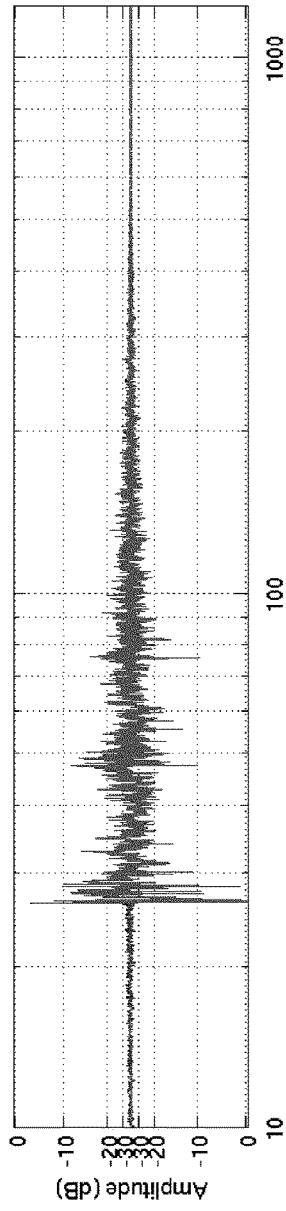
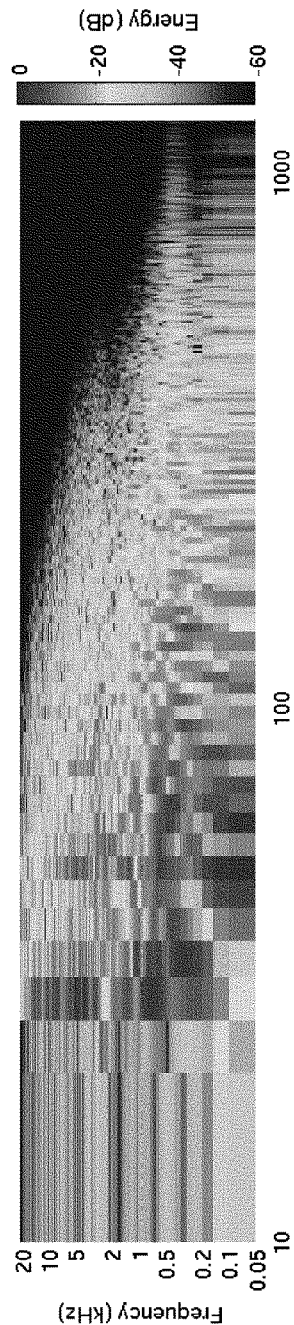
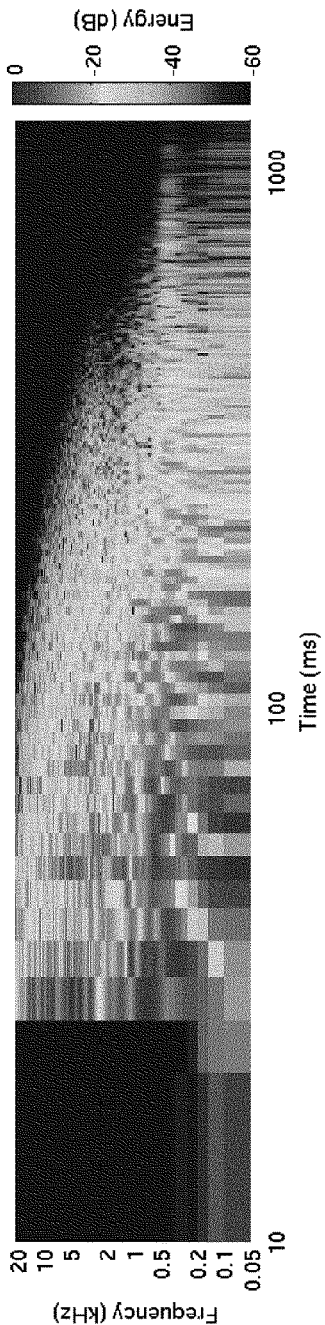
FIG. 3(A)
FIG. 3(B)
FIG. 3(C)

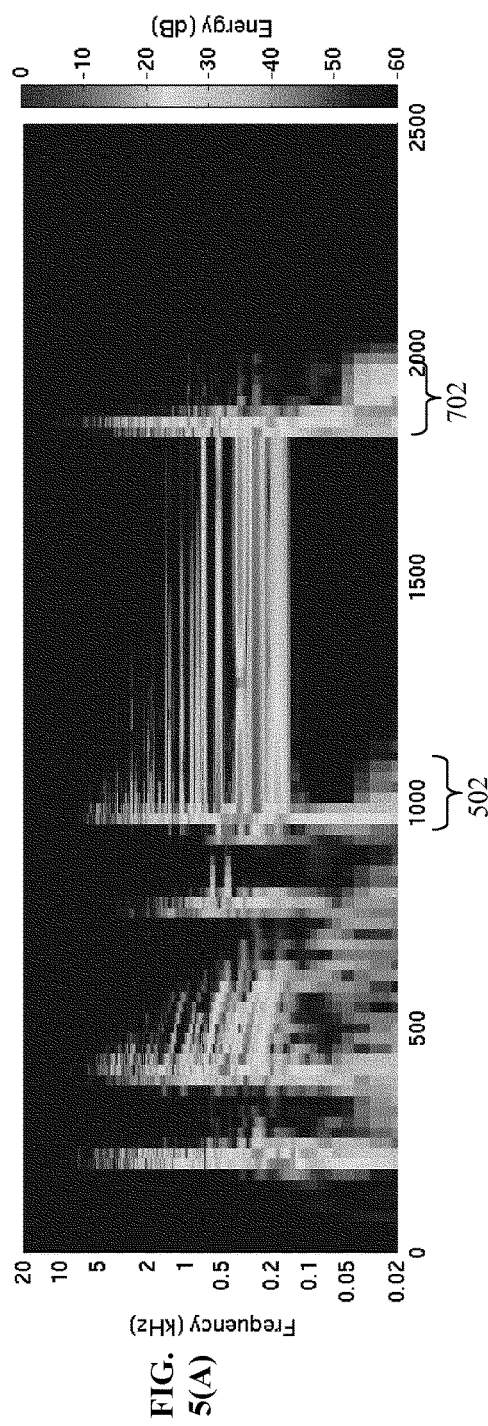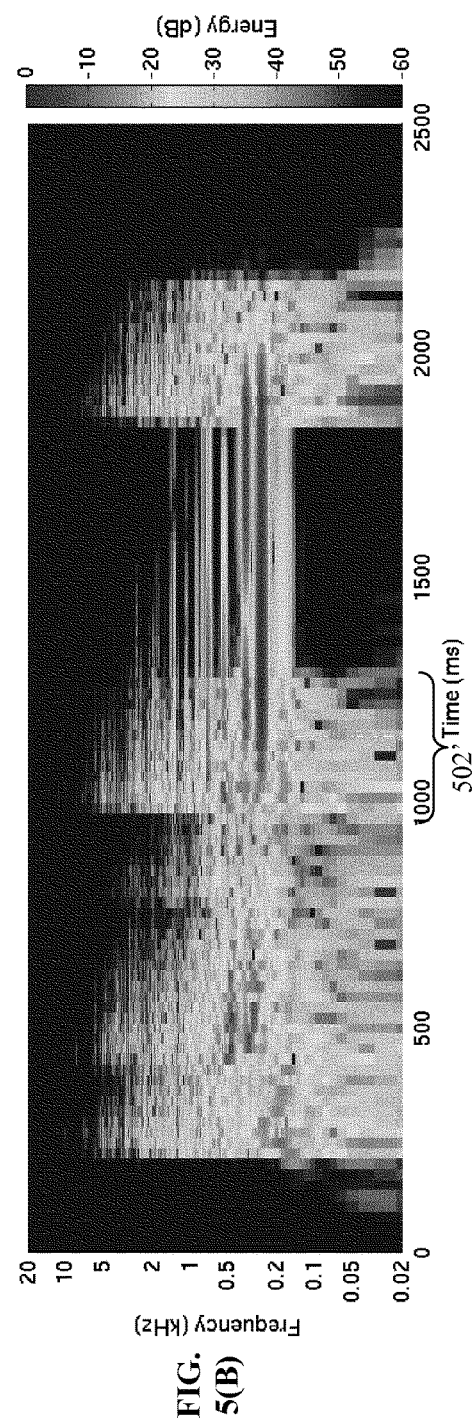
FIG. 5(A)
FIG. 5(B)

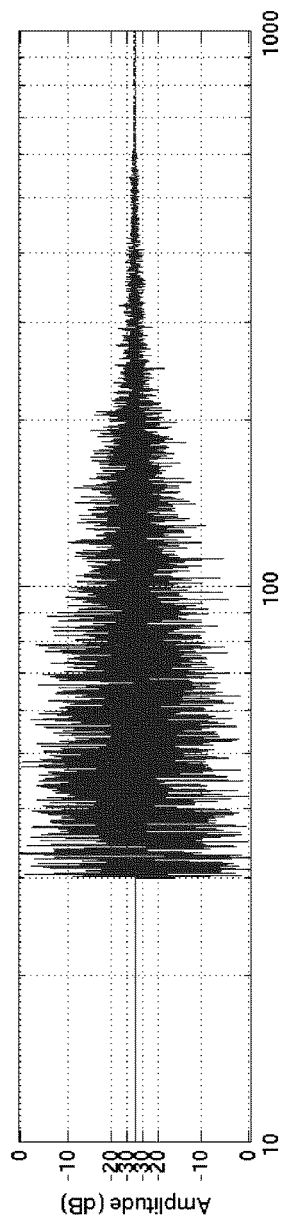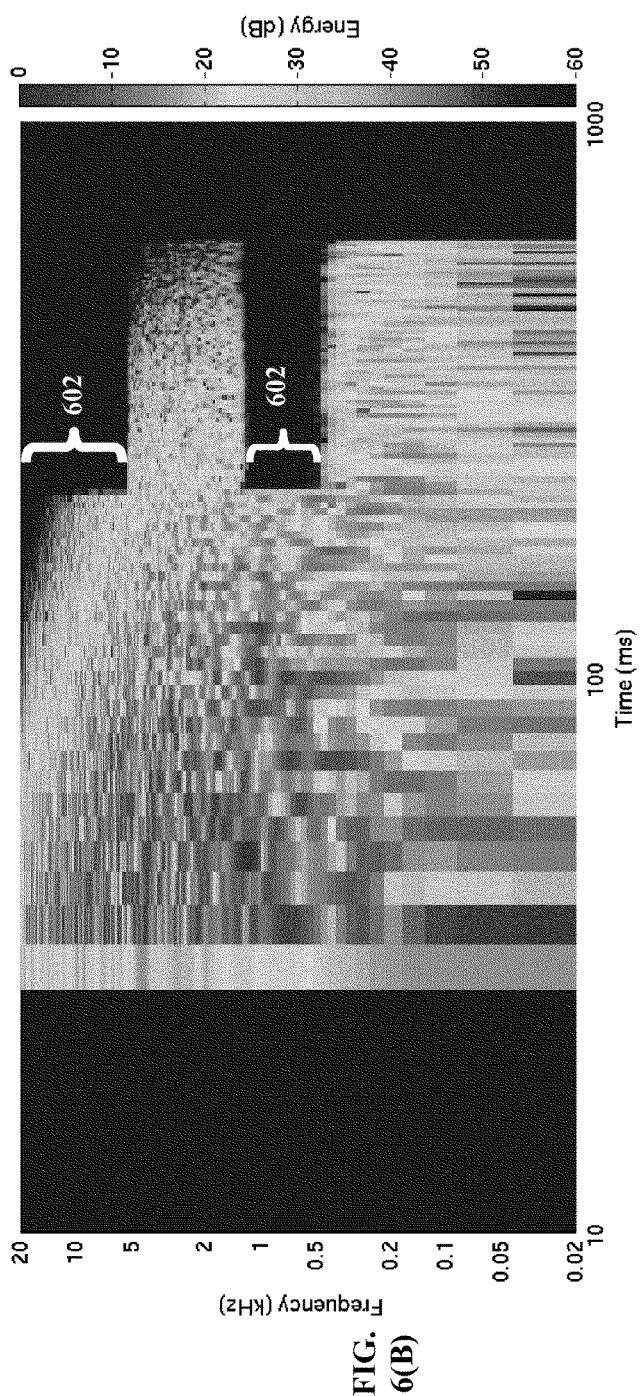
FIG. 6(A)
FIG. 6(B)

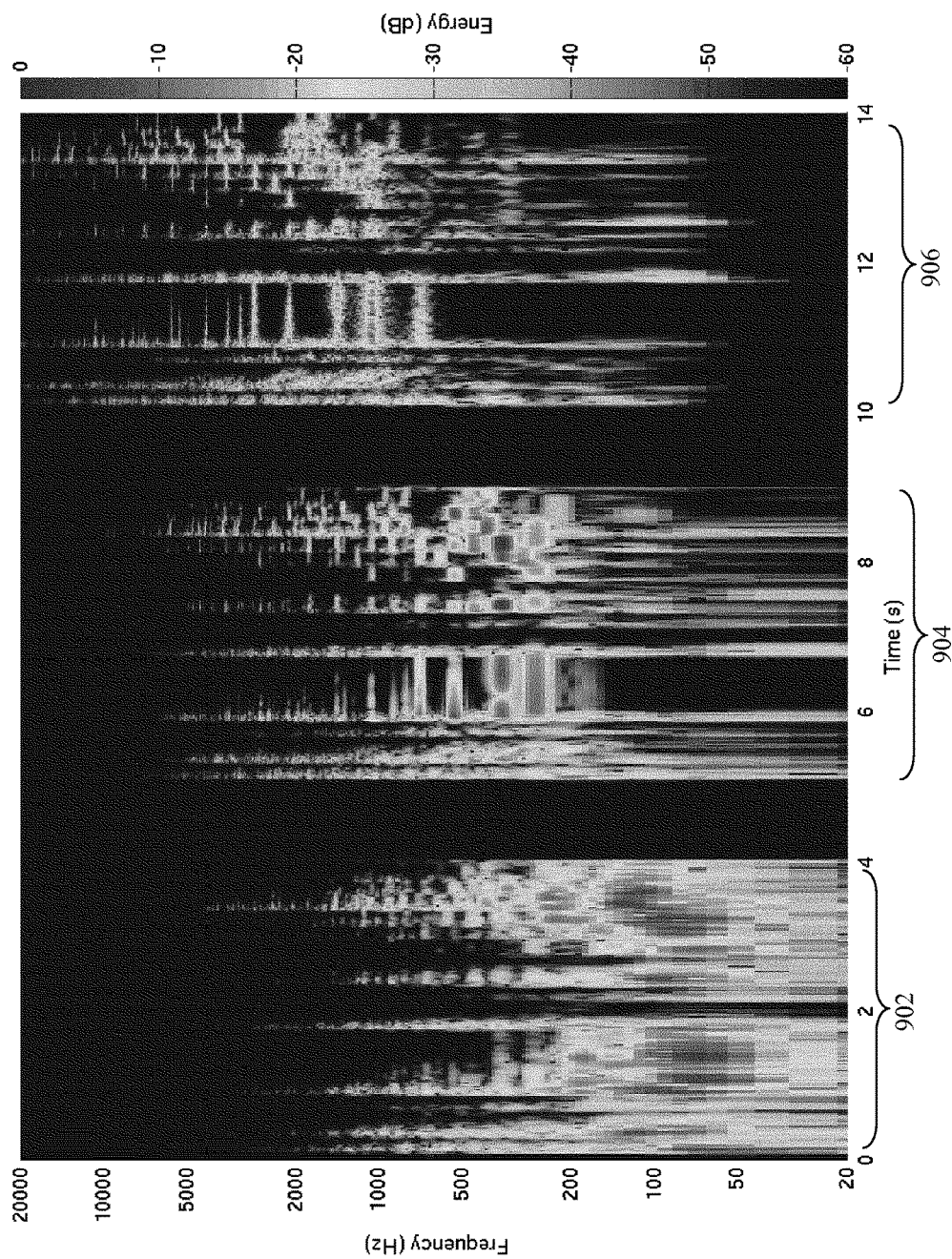

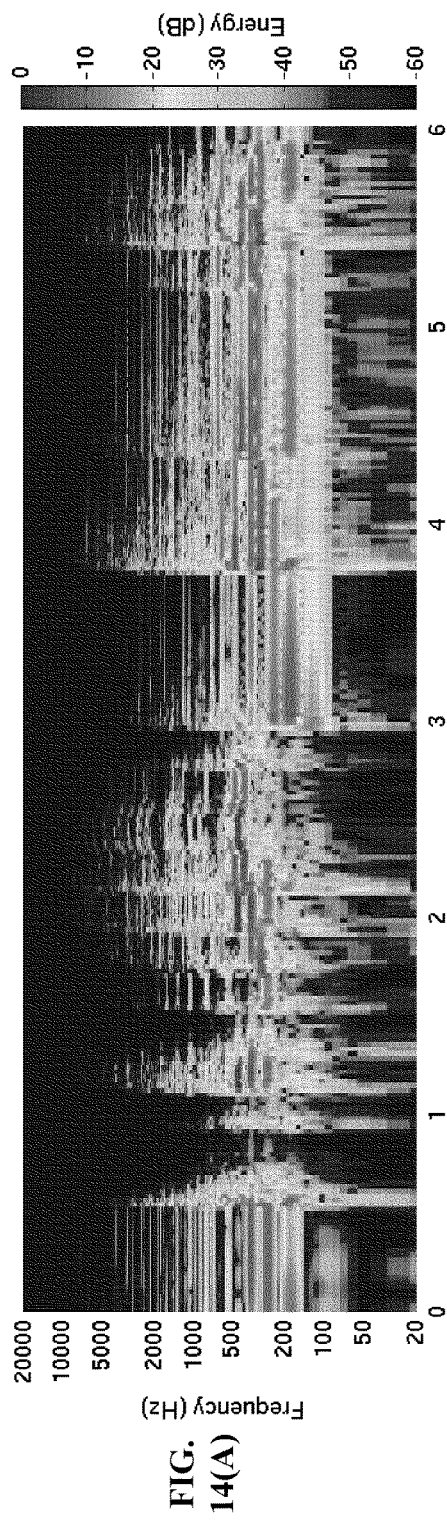
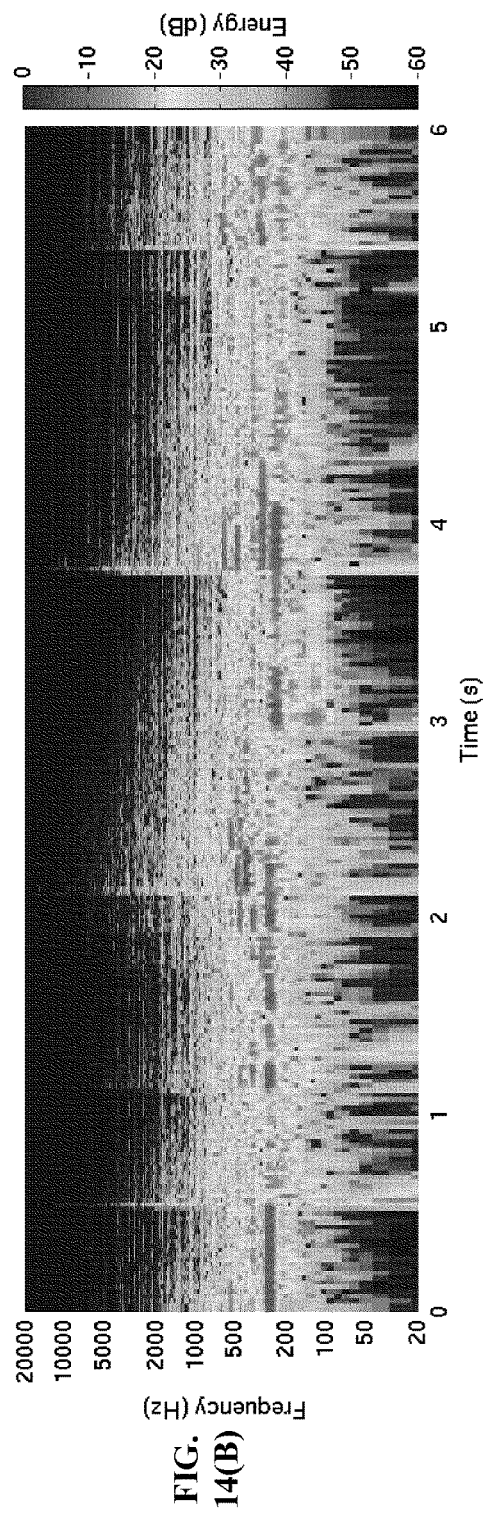
FIG. 14(A)
FIG. 14(B)

DISTORTION AND PITCH PROCESSING USING A MODAL REVERBERATOR ARCHITECTURE

CROSS-REFERENCE TO RELATED APPLICATIONS

The present application claims priority to U.S. Prov. Appln. No. 62/188,299 filed Jul. 2, 2015, the contents of which are incorporated by reference herein in their entirety.

TECHNICAL FIELD

The present invention relates generally to audio signal processing, and more particularly to methods and apparatuses for adding audio effects such as distortion and pitch shifting in an artificial reverberator based on a modal reverberator architecture.

BACKGROUND

Various techniques for performing artificial reverberation in audio signal processing are known. The techniques and architectures for performing artificial reverberation disclosed in U.S. application Ser. No. 14/558,531 dramatically advanced the state of the art. However, opportunities for further advances are possible.

SUMMARY

According to certain general aspects, the present invention relates to methods and apparatuses for adding audio effects such as distortion and pitch shifting in an artificial reverberator based on a modal reverberator architecture. In embodiments, the modal reverberator algorithm is adapted to produce audio effects in four categories: reverberation envelope control, time stretching, pitch manipulation, and distortion processing. In these and other embodiments, desired effects are achieved by implementing the resonant mode filters as cascades of heterodyning, smoothing, and modulation steps, and manipulating aspects of the smoothing and modulation operations. The parallel nature of the modal architecture allows for different effects or no effect to be applied on a per mode or per mode group basis. The sample-by-sample processing allows continuous control of all effects parameters without latency and with no blocking artifacts.

In accordance with these and other aspects, a method according to embodiments of the invention includes receiving a source signal, applying artificial reverberation to the source signal by processing the source signal in parallel using a plurality of mode filters, and summing outputs of the plurality of mode filters to produce an artificially reverberated version of the source signal, wherein each of the mode filters is implemented as a cascade of separate heterodyning, smoothing and modulation functions and wherein the method further includes performing one or more of gated reverberation by adjusting the smoothing function, performing time stretching by performing a resampling of the smoothing function output, performing pitch shifting by using different frequencies for the heterodyning and modulation functions and applying a distortion process in addition to the artificial reverberation.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein:

FIGS. 3(A) to 3(C) are diagrams illustrating measured and modeled room impulse responses for an example modal reverberator design according to embodiments of the invention.

FIGS. 5(A) and 5(B) are spectrograms illustrating an example of a modal gated reverberator processed guitar track according to embodiments of the invention.

FIGS. 6(A) and 6(B) are an example impulse response diagram and spectrogram, respectively, for a modal gated reverberator according to embodiments of the invention.

FIG. 9 is an example spectrogram for a guitar track processed with a modal reverberator having pitch shifting effects according to embodiments of the invention.

FIGS. 14(A) and (B) are example spectrograms for a guitar track processed with different modal distortion effects according to embodiments of the invention.

DETAILED DESCRIPTION OF THE PREFERRED EMBODIMENTS

Figure 1:
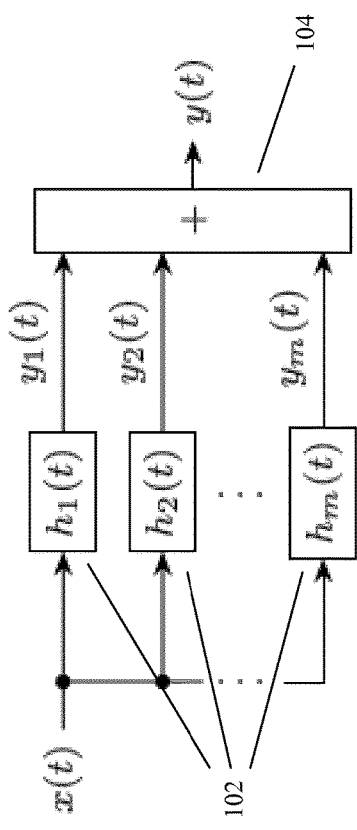
FIG. 1 is a block diagram illustrating a modal reverberator architecture according to embodiments of the invention in which the modal reverberator is the parallel combination of resonant filters matched to the modes of the system.

The present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

According to certain general aspects, embodiments of the invention build upon a modal reverberator architecture and algorithm described in U.S. application Ser. No. 14/558,531, the contents of which are incorporated herein by reference in their entirety. In some embodiments, the modal reverberator architecture and algorithm are adapted to include audio effects such as pitch shifting and distortion. For example, the parallel architecture of the modal reverberator provides explicit, interactive control over the parameters of each mode, allowing accurate modeling of acoustic spaces, as well as movement within them and morphing among them. Accordingly, embodiments of the invention extend this structure to allow manipulation of the mode responses in ways that lead to alternative implementations of audio effects such as distortion and pitch shifting, and to novel effects which integrate reverberation into nonlinear processes.

By way of introduction, the present inventors recognize that the "modal reverberator" algorithm (see, e.g. J. S. Abel, S. Coffin, and K. S. Spratt, "A modal architecture for artificial reverberation," The Journal of the Acoustical Society of America, vol. 134, no. 5, pp. 4220, 2013 and J. S. Abel, S. Coffin, and K. Spratt, "A modal architecture for artificial reverberation with application to room acoustics modeling," in Audio Engineering Society Convention, Los Angeles, Calif., Oct. 9-12, 2014, vol. 137) proposed a unification of perspectives on room reverberation analysis with the goals of synthetic reverberation. While room reverberation has long been analyzed from the viewpoint of modal analysis (see, e.g. A. H. Benade, Fundamentals of Musical Acoustics, Oxford University Press, 1976, pg. 172, ff. and P. M. Morse and K. U. Ingard, Theoretical acoustics, Princeton University Press, 1987, pg. 576, ff.), artificial reverberation is typically synthesized using structures such as delay networks or convolution which attempt to reproduce time domain features of the room response (see, e.g., V. Välimäki, J. D. Parker, L. Savioja, J. O. Smith III, and J. S. Abel, "Fifty years of artificial reverberation," IEEE Transactions on Audio, Speech, and Language Processing, vol. 20, no. 5, pp. 1421-1448, July 2012). By contrast, the modal reverberator implements room modes directly as the sum of parallel resonant filters.

According to certain aspects, the present inventors recognize the modal reverberator algorithm's potential as a platform for new musical effects, including but not limited to gating and envelope processing, time stretching, pitch manipulation, and distortion processing. The techniques for adding these new effects will be provided in more detail below. However, the invention is not limited to these effects and those skilled in the art will be able to implement additional or alternative effects after being taught by the present disclosure.

As described in the co-pending application, acoustic spaces and vibrating objects have long been analyzed in terms of their normal modes. The impulse response h(t) between a pair of points in the system may be expressed as the linear combination of mode responses $$h(t) = \sum_{m=1}^{M} h_m(t), \tag{1}$$

where the system has M modes, with the mth mode response denoted by $h_m(t)$, t being the discrete time sample index. The system output y(t) in response to an input x(t), the convolution $$y(t) = h(t) * x(t), \tag{2}$$

is then seen to be the sum of mode outputs $$y(t) = \sum_{m=1}^{M} y_m(t), \; y_m(t) = h_m(t) * x(t), \tag{3}$$

where the mth mode output $y_m(t)$ is the mth mode response convolved with the input. The modal reverberator of the co-pending application simply implements this parallel combination of mode responses (3), as shown in FIG. 1. More particularly, the modal reverberator 100 is the parallel combination of resonant filters 102 respectively matched to the modes m of the system, each receiving and processing the input signal x(t) and whose outputs $y_m(t)$ are combined together by summer 104.

In general, mode responses $h_m(t)$ are complex exponentials, each characterized by mode parameters including mode frequency $\omega_m$, mode damping $\alpha_m$ and complex mode amplitude $\gamma_m$, $$h_m(t) = \gamma_m \exp\{(j\omega_m - \alpha_m)t\}. \tag{4}$$

The choice of complex, rather than real, mode responses is made here for clarity of presentation and to suggest the implementation structures described below. A real response would be formed by a combinations of conjugate responses; here a proportional result is formed by taking the real part of each complex mode response. A stereo effect can be obtained by taking the imaginary part as a second channel.

The mode frequencies and dampings are properties of the room or object. They describe, respectively, the mode oscillation frequencies and decay times. The mode amplitudes are determined by the sound source and listener positions (e.g. driver and pick-up positions for an electro-mechanical device), according to the mode spatial patterns.

Note that even for short reverberation times of just a few hundred milliseconds, the mode responses $h_m(t)$ are very resonant, and last many thousands of samples at typical audio sampling rates. In implementing the mode filters, therefore, numerically stable methods must be used. One such method is the phasor filter (see, e.g., M. Mathews and J. O. Smith III, "Methods for synthesizing very high Q parametrically well behaved two pole filters," in Proceedings of Stockholm Musical Acoustics Conference (SMAC), Stockholm, Sweden, Aug. 6-9, 2003 and D. Massie, "Coefficient interpolation for the max Mathews phasor filter," in Audio Engineering Society Convention, San Francisco, Calif., Oct. 26-29, 2012, vol. 133), in which each mode filter is implemented as a complex first-order update, $$y_m(t)=\gamma_m x(t)+e^{(j\omega_m-\alpha_m)}y_m(t-1). \tag{5}$$

Another approach is to rearrange the mode response convolution, $$y_m(t) = \sum_\tau \gamma_m e^{(j\omega_m-\alpha_m)(t-\tau)}x(\tau) \tag{6}$$

$$= e^{j\omega_m t}\sum_\tau \gamma_m e^{-\alpha_m(t-\tau)}[e^{-j\omega_m\tau}x(\tau)]. \tag{7}$$

In embodiments of the present invention, the mode filtering of each filter 102 is implemented by heterodyning the input signal to dc to form a baseband response, smoothing this baseband response by convolution with an exponential, and modulating the result back to the original mode frequency, all of which can be expressed mathematically as $$y_m(t)=e^{j\omega_m t}\cdot(\gamma_m e^{-\alpha_m t}*[e^{-j\omega_m t}x(t)]). \tag{8}$$

Figure 2:
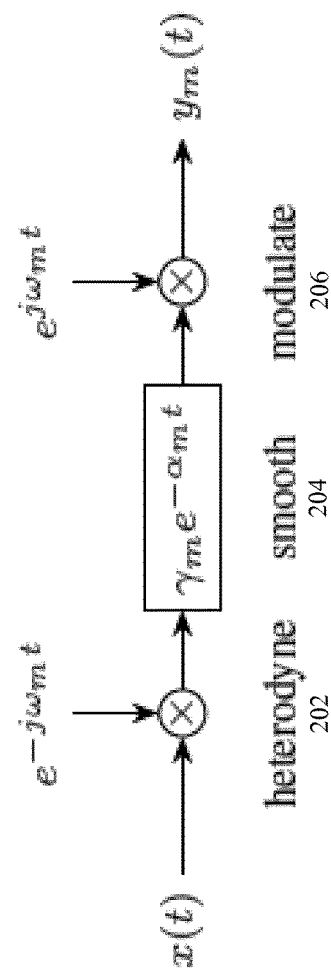
FIG. 2 is a block diagram illustrating an example mode response implementation according to embodiments of the invention.

An example implementation of this process (8) is shown in FIG. 2. The heterodyning 202 and modulation 206 steps implement the mode frequency, and the smoothing filter 204 generates the mode envelope, in this case an exponential decay Using this architecture, rooms and objects may be simulated by tuning the filter resonant frequencies and dampings to the corresponding room or object mode frequencies and decay times using the tuning techniques described in the co-pending application, for example. The parallel structure allows the mode parameters to be separately adjusted, while the updates (5) or (8) provide interactive parameter control with no computational latency.

In particular, three design approaches are described in the co-pending application for designing the mode parameters that can be used to implement the modal reverberator shown in FIG. 2: behavioral, analytical, and perceptual. The behavioral approach fits mode parameters to system measurements. The analytic approach derives mode parameters from the physics of the system. The perceptual approach selects mode parameters according to desired wet response equalization and, for example, early and late decay times. An example result of a behavioral design approach described in the co-pending application is shown in FIGS. 3(A) to 3(C), in which a modal reverberator architecture is fit to the measured impulse response of a classroom. For this design, 1605 modes were used, and the modal system response was a close perceptual match to that of the measurement.

In particular, FIGS. 3(A) and (C) show the amplitude and spectrogram, respectively, of a measured room impulse responses for a roughly 10 m×12 m×5 m classroom, Room K217 at The Knoll, Stanford University. FIG. 3(B) shows the spectrogram for a modeled impulse response using the modal reverberator architecture and mode parameter design approach of the co-pending application.

As set forth above, the present inventors recognize that the modal reverberator architecture of the co-pending application lends itself to effects processing through its parallel architecture and dense, narrowband mode responses. In the following, four categories of effects are presented, all provided by manipulating, modifying or adapting different blocks of the mode response processor shown in FIG. 2: (1) gating and envelope processing, (2) time stretching, (3) pitch manipulation, and (4) distortion processing. It should be noted that the invention is not limited to these four categories, and others are possible as will be appreciated by those skilled in the art after being taught by the present disclosure.

In example embodiments described in more detail below, reverberation envelope effects such as gating and iterated convolution may be achieved by manipulating the smoothing filter 204 response. Time stretching without pitch shifting is possible by re-sampling the smoothing filter 204 output. Pitch manipulation effects such as pitch shifting and spectral "inversion" are available by using different sinusoid frequencies for the heterodyning and modulation steps 202 and 206. Finally, distortion effects may be generated by distorting or substituting for the modulation 206 sinusoid waveform. Since these effects are integrated into a reverberation architecture, their sonics are different than their standard counterparts when the mode decay times are longer than a few hundred milliseconds. The result is a unique effect with sonic qualities of both the standard effect and reverberation.

Example techniques for performing reverberation envelope effects according to embodiments of the invention will now be described in more detail. Gated reverberation is a reverberation effect in which the reverberation response onset is rapidly forced to zero after a short period of time, for example 250 ms. One approach, used by the AMS RMX-16, one of the first digital reverberators and popular in the 1980's (see, e.g., "Ams neve history ams neve," http://ams-neve.com/about-us/ams-neve-history/80s), implements a system impulse response which decays very rapidly after a given point in time.

In the modal architecture of the present embodiments, the individual mode responses are decaying exponentials, and the present inventors recognize that these may be "switched off" after a specified delay using a truncated IIR (TIIR) technique (see, e.g., A. Wang and J. O. Smith III, "On fast FIR filters implemented as tail-canceling IIR filters," IEEE Transactions on Signal Processing, vol. 45, no. 6, pp. 1415-1427, 1997). A first-order mode filter impulse response may be truncated after a given delay by subtracting from its input an appropriately scaled, delayed version of the input. Stated mathematically, the mth mode filter impulse response $$h_m(t)=e^{(j\omega_m-\alpha_m)t} \tag{9}$$

can be made zero starting at a delay δ by replacing the input x(t) with $$x(t)-e^{(j\omega_m-\alpha_m)\delta}x(t-\delta). \tag{10}$$

Figure 4A:
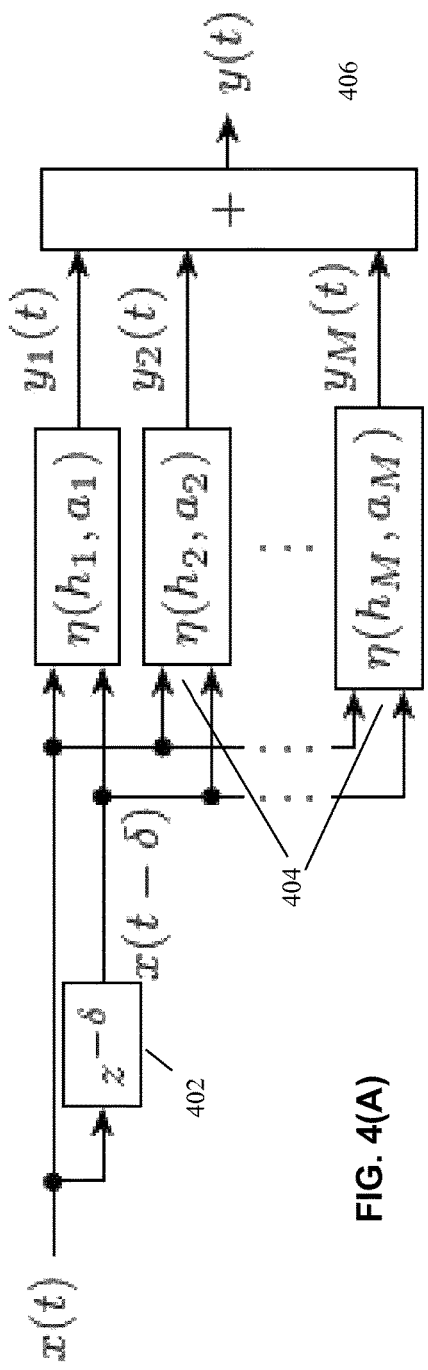
FIGS. 4(A) and 4(B) are block diagrams illustrating an example modal gated reverberator signal flow architecture according to embodiments of the invention.
Figure 4B:
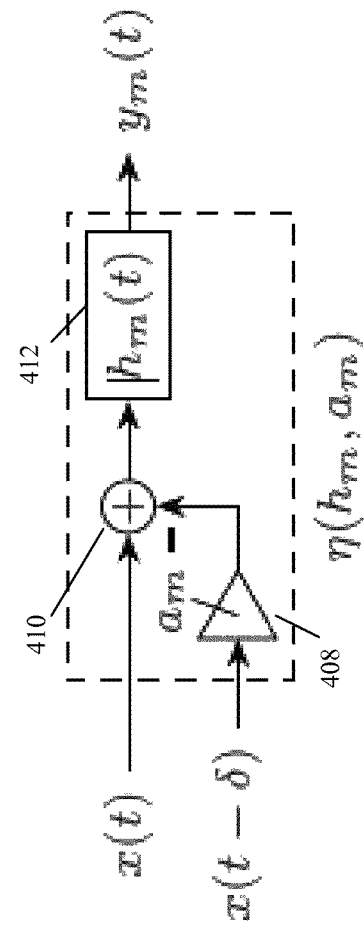

This is implemented in the example modal gated reverberator signal flow architecture shown in FIGS. 4(A) and 4(B).

More particularly, FIG. 4(A) is a block diagram of an example gated modal reverberator 400 comprised of a parallel combination of gated resonant filters 404 respectively matched to the modes m of the system, each receiving and processing the input signal x(t) and its delayed version x(t−δ) via delay 402 and whose outputs $y_m(t)$ are combined together by summer 406.

FIG. 4(B) is a block diagram of an example individual filter 404. Note that in addition to mode response filter 412 included in the original modal reverberator architecture, the effects processing of these embodiments, which varies from mode to mode, is implemented by subtracting a scaled version of delayed signal x(t−δ) formed using scaler 408 and the input signal x(t) via summer 410 and providing this combined signal as input to filter 412.

FIGS. 5(A) and 5(B) are example spectrograms illustrating dry and processed guitar tracks, respectively in accordance with these embodiments of the invention. Note the transients such as 502 are reverberated but truncated after a certain amount of time as 502'. In this example, the reverberator 400 employed 2048 modes, with decay times ranging from 2500 ms in the mid frequencies to 200 ms in the high frequencies. The gate time δ was set to 290 ms in this example. As a result, transients in the processed guitar track reverberated for only 290 ms before truncation in this example.

Two possible variations to the processing described above should be noted. In one possible variation, an interesting "gated cathedral" sound results when a long reverberation time is used, and the response isn't fully truncated. This can be accomplished by slightly reducing the magnitude of the scale factor, e.g., to $0.95 \exp\{(j\omega_m - \alpha_m)\delta\}$.

Another possible artistic effect forms groups of modes, with different groups having different gate times δ. An example impulse response shown in FIG. 6(A) of such an example modal gated reverberator having a shorter gate time $\delta_1$ of 180 ms for certain frequency bands 602, and a longer gate time $\delta_2$ of 580 ms for others is apparent in the corresponding spectrogram is shown in FIG. 6(B). Logarithmic time axes are used in FIGS. 6(A) and 6(B).

The TIIR approach of these embodiments may also be used with higher order mode response filters. For instance, repeated pole filters having N poles and impulse response onsets roughly proportional to $t^{N-1}$ can be truncated to generate a "reverse reverberation" effect. To implement such filters, the structure of FIG. 4(A) can be augmented with additional delay lines 402 having lengths equal to integer multiples of δ, up to Nδ. Finally, reverse reverberation can also be implemented using the TIIR approach with a growing exponential mode envelope.

Another reverberation envelope effect is iterated reverberation, the repeated application of a reverberant impulse response, inspired by Alvin Lucier's piece "I am sitting in a room" (see, e.g., J. S. Abel and M. J. Wilson, "Luciverb: Iterated convolution for the impatient," in Audio Engineering Convention, San Francisco, Calif., Oct. 26-29, 2012, vol. 133). Since the mode responses are orthogonal, the order-N iterated convolution of the system response h(t), $$h^{*N}(t) = \underbrace{h(t) * h(t) * \ldots * h(t)}_{N \text{ responses}}, \quad (11)$$

is the sum of the mode response iterated convolutions, $$h^{*N}(t) = \sum_{m=1}^{M} h_m^{*N}(t). \quad (12)$$

The mode response iterated convolutions may be implemented using the approach of (8), in which the heterodyning and modulation operations 202 and 206 are left unchanged and the mode envelope filter 204 is cascaded with itself (i.e., iterated) N times. Doing so produces a mode envelope proportional to $t^{N-1} \exp\{-\alpha_m t\}$, which provides a delayed onset of late field energy, peaking at a time $(N-1)/\alpha_m$.

Additional reverberation envelopes include delayed onset and two-stage decays, as would be appropriate for modeling coupled spaces such as a box in an opera hall, and as described in E. Piirilä, T. Lokki, and V. Välimäki, "Digital signal processing techniques for non-exponentially decaying reverberation," in Proceedings of COST-G6 Workshop on Digital Audio Effects (DAFx), Barcelona, Spain, Nov. 19-21, 1998, vol. 1 and K. S. Lee and J. S. Abel, "A reverberator with two-stage decay and onset time controls," in Proceedings of the Audio Engineering Society Convention, San Francisco, Calif., Nov. 4-7, 2010, vol. 129. These can be implemented in the context of the modal reverberator structure by design of the mode envelope filter 204 in a manner similar to that described in K. S. Lee and J. S. Abel, "A reverberator with two-stage decay and onset time controls," in Proceedings of the Audio Engineering Society Convention, San Francisco, Calif., Nov. 4-7, 2010, vol. 129. Alternatively, a two-stage decay may be implemented by having the filter 204 for some modes take on a large amplitude and decay quickly while the filter 204 for other modes have a smaller amplitude and decay slowly.

Techniques for performing time stretching effects according to embodiments of the invention will now be described in more detail. Note that in the modal reverberator structure of FIG. 1 and FIG. 2, a reverberated signal is constructed from its mode responses, each of which is generated by applying its mode envelope to a sinusoid at its mode frequency. If the mode decay times are short (less than, for example, a couple hundred milliseconds) and the mode energies are inversely proportional to the frequency density of nearby modes, then the processed audio will sound much like the input. In this case, the present inventors recognize that if all of the mode envelopes produced by filter 204 are resampled to a stretched time axis, then the resulting signal will be a time-stretched version of the input.

Figures 7A, 7B, 7C:
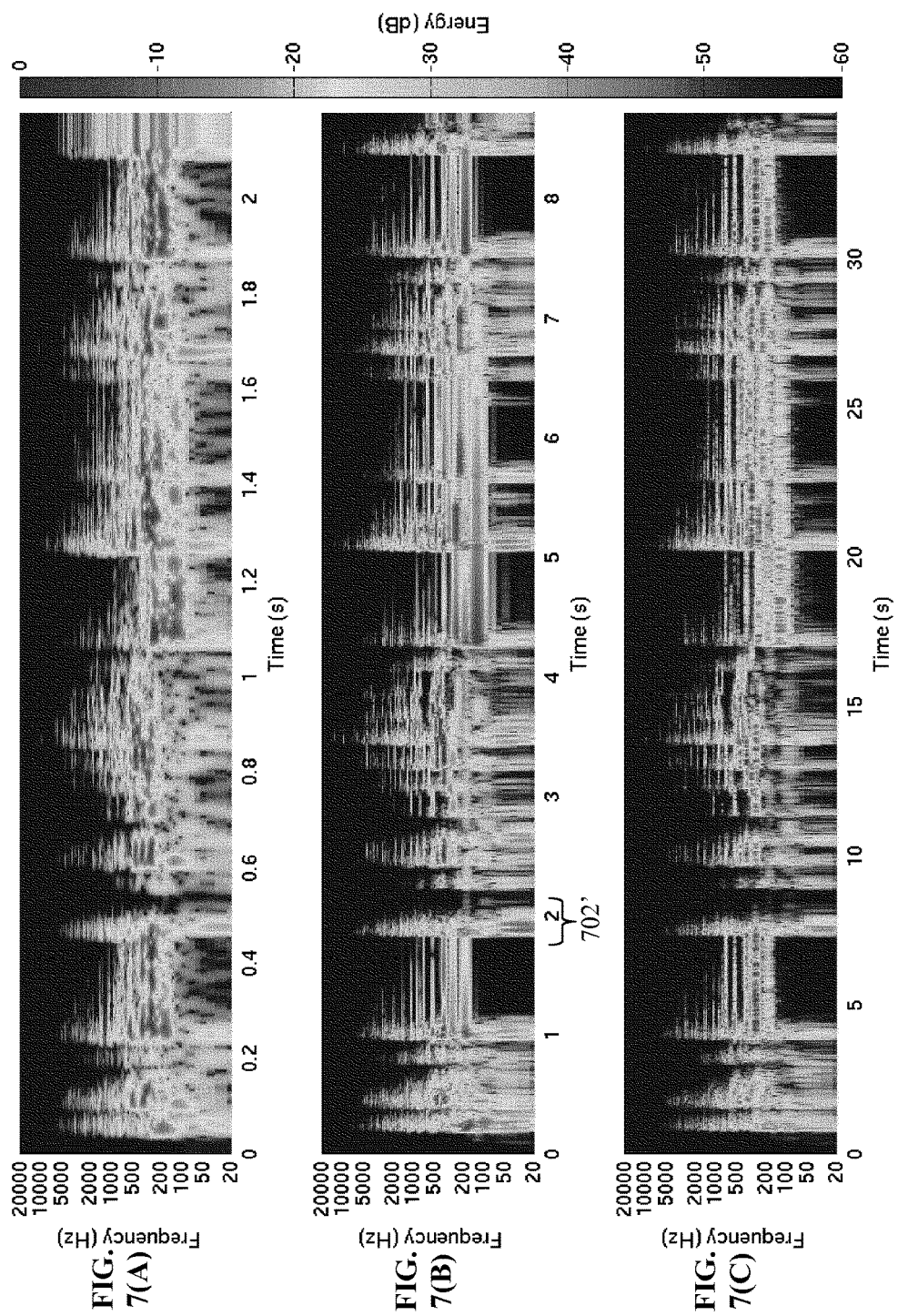
FIGS. 7(A) to 7(C) are example spectrograms for a guitar track processed with a mode envelope filter and resampling according to embodiments of the invention.

As an example, FIGS. 7(A) to 7(C) show spectrograms of the dry guitar track of FIG. 4(A) time stretched using these resampling techniques by factors of 0.25, 1, and 4 respectively. More particularly, in these examples, the guitar track of FIG. 4(A) is processed using a 2400-mode processor with randomly selected, exponentially distributed mode frequencies in the range 20 Hz to 20 kHz and having 200 ms decay times. The mode envelope filter 204 output in these examples is re-sampled to produce signals with 0.25 (FIG. 7(A)), 1 (FIG. 7(B)), and 44 (FIG. 7(C))) times the number of samples in the original mode envelope output signal, which is originally sampled at the system sampling rate of 48 kHz. Note that the spectra are similar under the appropriate time axis scalings. While the timbers of the time-stretched signals match well, there are differences between the dry input and the slightly reverberated signal generated without resampling the mode envelope. For example, transients such as 702 in the dry signal shown in FIG. 5(A) are less crisp as shown by 702' in FIG. 7(B).

One other artifact appears, a subtle beating or tremolo heard during sustained notes. Using a second-order smoothing filter for 204, for example the first-order filter repeated, effectively eliminates the problem. The examples of FIGS. 7(A) to 7(C) were generated with such a second-order mode envelope. Finally, as the smoothing filter 204 output has relatively low bandwidth, linear interpolation is expected to be sufficient for resampling, and was used to generate the time stretched signals of FIGS. 7(A) to 7(C).

It should be noted that the time stretching can vary with time so as to compress or expand the time axis of different sections of the signal by different amounts. In addition, the parallel structure makes it simple to vary the time axis modification over frequency, for instance, having low frequencies time expanded and high frequencies time compressed.

Techniques for performing pitch manipulation effects according to example embodiments of the invention will now be described in more detail.

Figure 8:
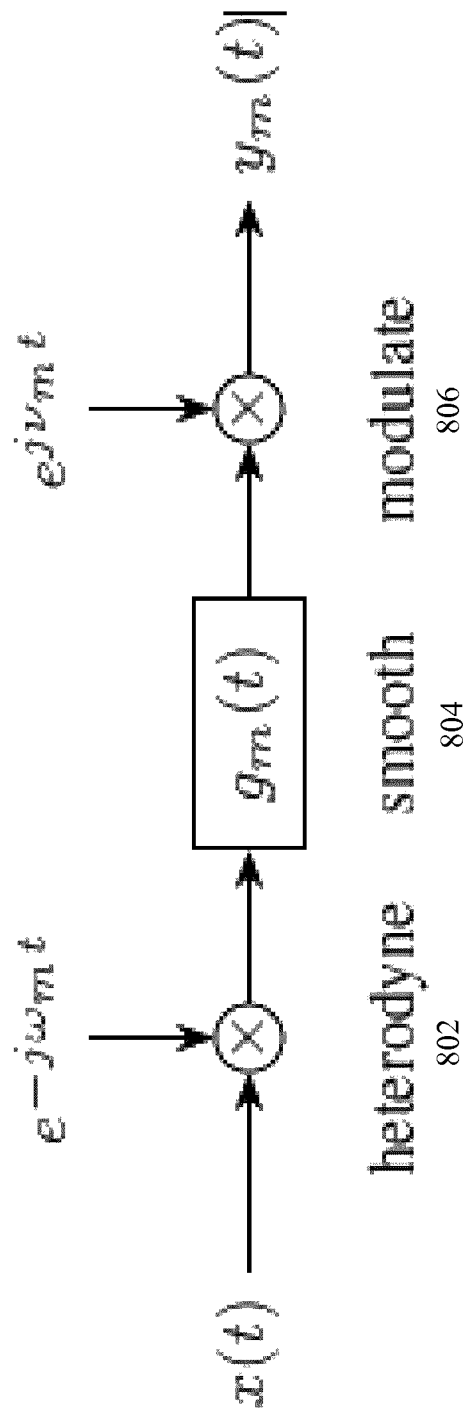
FIG. 8 is a block diagram of an example pitch shifting mode response implementation according to embodiments of the invention.

Recall that the mode response can be thought of as the cascade of heterodyning 202, smoothing 204, and modulation 206 operations, as shown in FIG. 2. Now consider replacing each modulation frequency $\omega_m$ with one shifted by $\sigma$ semi-tones (i.e. steps of 1/12 of an octave), $$v_m = 2^{\sigma/12} \omega_m, \quad (13)$$

as seen in the block diagram of FIG. 8. More particularly as shown in FIG. 8, an example pitch shifting mode response in these example embodiments is implemented by causing the modulation step 806 to use a different frequency that that used in heterodyning step 802. Doing so will shift the pitch of the output $y_m(t)$ relative to the input $x(t)$.

An example result of this processing is illustrated in FIG. 9, in which a guitar track is shifted by −2 (generally shown as 902), 0 (generally shown as 904), and 2 (generally shown as 906) octaves. More particularly, in this example, spectrograms are shown for a guitar track processed with a modal reverberator having 2400 modes and a 200 ms decay time, and pitch shifted as set forth above. Note that the shifted spectrograms are well matched, save the constant frequency resolution of the spectrogram.

As in the case of the time stretching effect above, it is possible to use higher order mode envelope filters to eliminate tremolo-type artifacts. The signals shown in FIG. 9 were prepared with three iterations of the first-order response (i.e., four-pole filters) (4), though one iteration works well. There is a trade-off involving the mode decay time: With a short decay time, the mode envelope filter has a wide bandwidth, resulting in beating between adjacent modes. With a long decay time, the beating is eliminated, but the output will take on a reverberant quality, which might be unwanted.

In the example of FIG. 9, 200 ms decay times and 2400 exponentially distributed mode frequencies were used. Little if any difference can be heard between deterministically and randomly generated mode frequencies. Random mode phases $\angle \gamma_m$ were also used, uniformly distributed on the interval 0 to $2\pi$, so that the system response to a pulse would lack structure, and therefore reduce temporal artifacts. Finally, note that modes shifted up or down in frequency outside the audio band need not be computed.

Figure 10A:
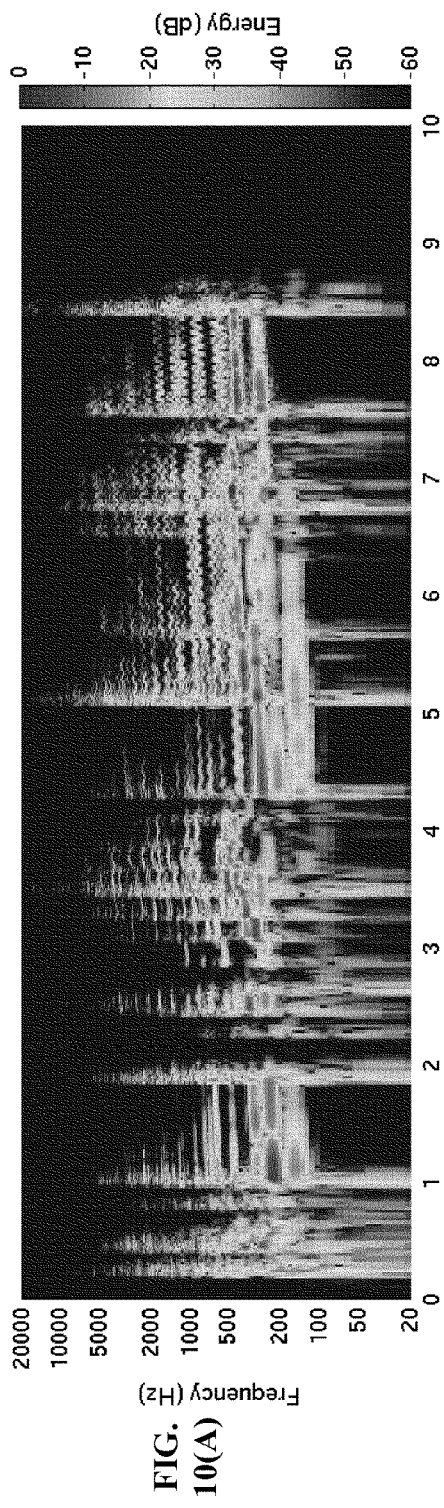
FIGS. 10(A) and 10(B) are example spectrograms of the guitar track of FIG. 9 processed according to a drifting, modulating pitch shift and different reverberation times according to embodiments of the invention.
Figure 10B:
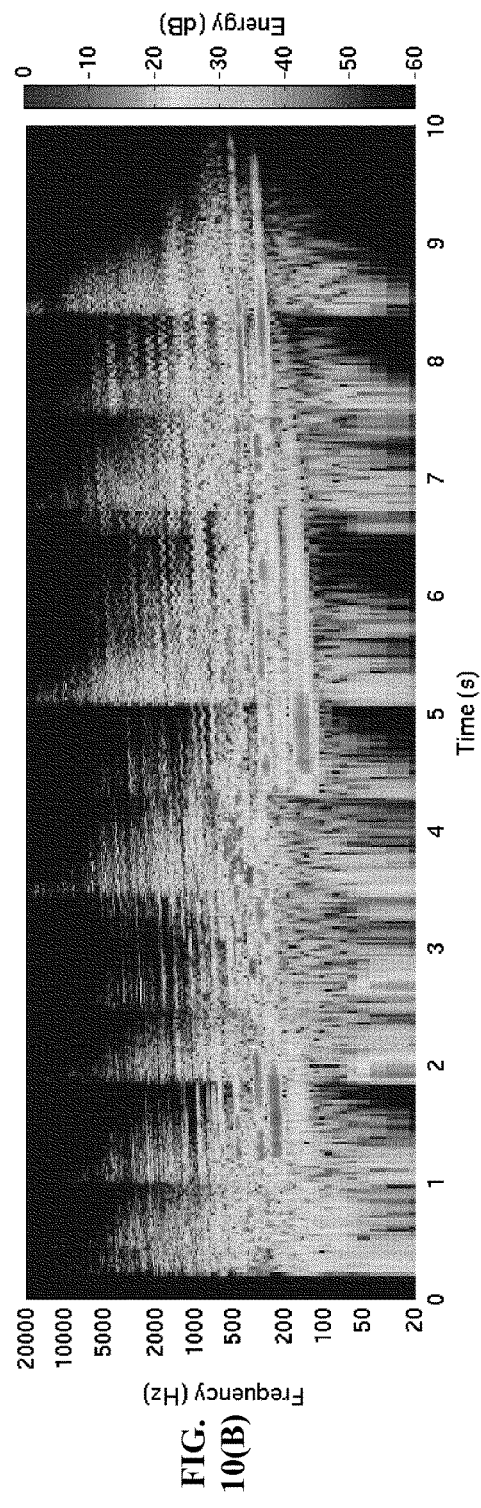

Since the modulation is computed on a sample-by-sample basis, the pitch shift may be changed on a sample-by-sample basis. Since the modes are independent, different pitch shifts may be applied to different modes. FIGS. 10(A) and 10(B) show how a pitch shift which drifts upward over time, and for input frequencies above about 200 Hz, develops a vibrato having an increasing rate. More particularly, FIG. 10(A) is a spectrogram of a guitar track of processed according to a drifting, modulating pitch shift, and FIG. 10(B) is a spectrogram of the same guitar track processed with the same pitch shift trajectory as in FIG. 10(A), but with a reverberation time of about 1.5 s. In this case the mode dampings were kept constant, and the reverberation time as a function of frequency $T_{60}(\omega)$ moves with the pitch shift. To keep the reverberation time independent of the pitch shift, the mode dampings could be set according to the instantaneous pitch shifted $T_{60}(2^{\sigma m(t)/12} \omega_m)$.

Other pitch effects may be produced by shifting different mode frequencies by different amounts. A number of strategies for generating the modulation frequencies are possible, including permuting the mode frequencies, generating random frequencies, and controlling the distance from the heterodyne frequencies to a quantized set of frequencies.

Another choice is aspectral "inversion," formed by inverting the mode frequencies about a center frequency, $\omega_c$, and applying a frequency shift, $$v_m = 2^{\sigma/12} \frac{\omega_e^2}{\omega_m}. \quad (14)$$

Figures 11A, 11B:
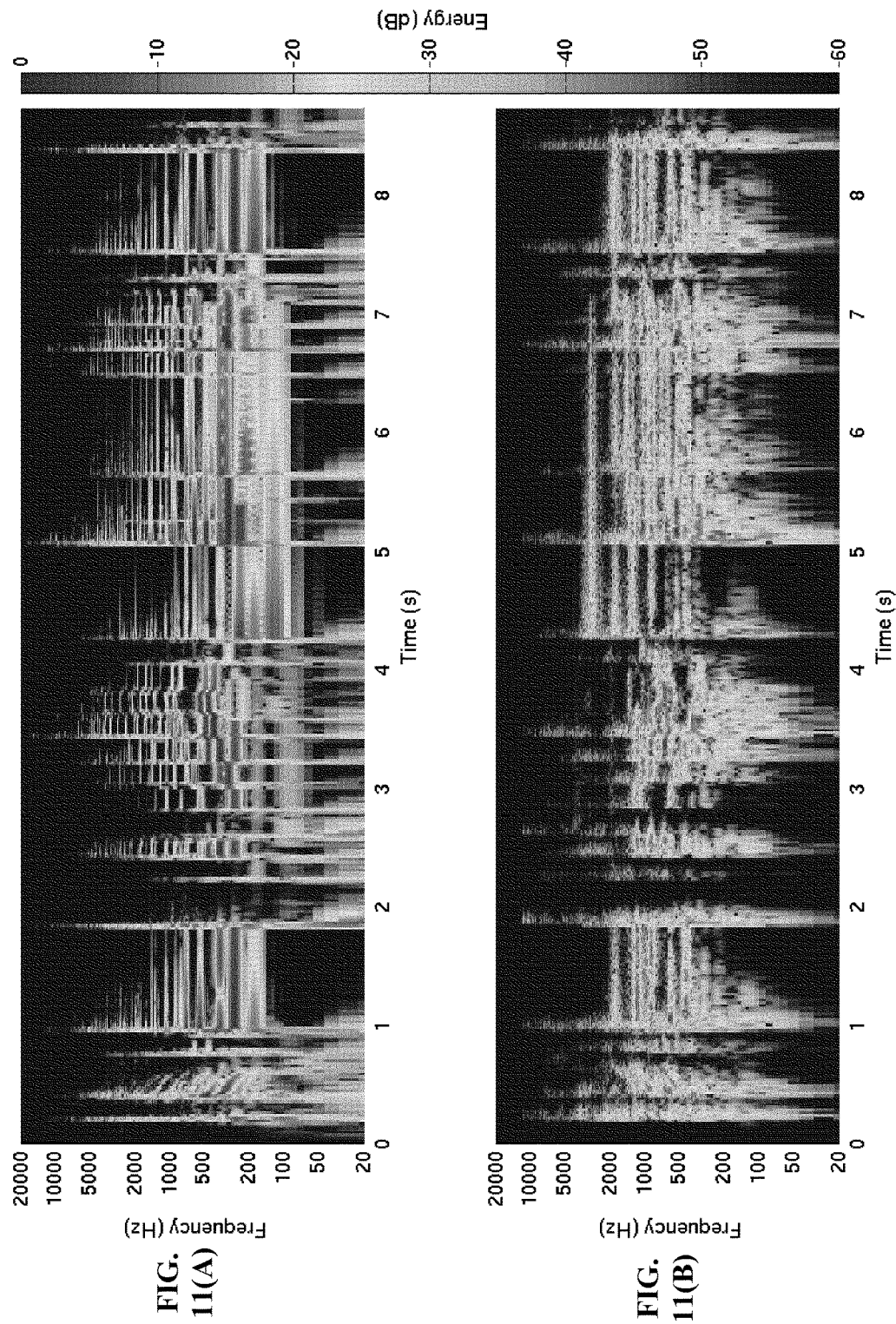
FIGS. 11(A) and (B) are example spectrograms for a guitar track processed in accordance with spectral inversion effects according to embodiments of the invention.

This effect creates different harmonic relationships among the partials present, as seen in the example of FIGS. 11(A) and 11(B). More particularly, FIG. 11(A) is a spectrogram for a dry guitar track and FIG. 11(B) is a spectrogram of a processed version of the track, in which the mode heterodyning 802 and modulation 806 frequencies are inverses of each other about 440 Hz.

Techniques for performing distortion effects according to example embodiments of the invention will now be described.

Figure 12:
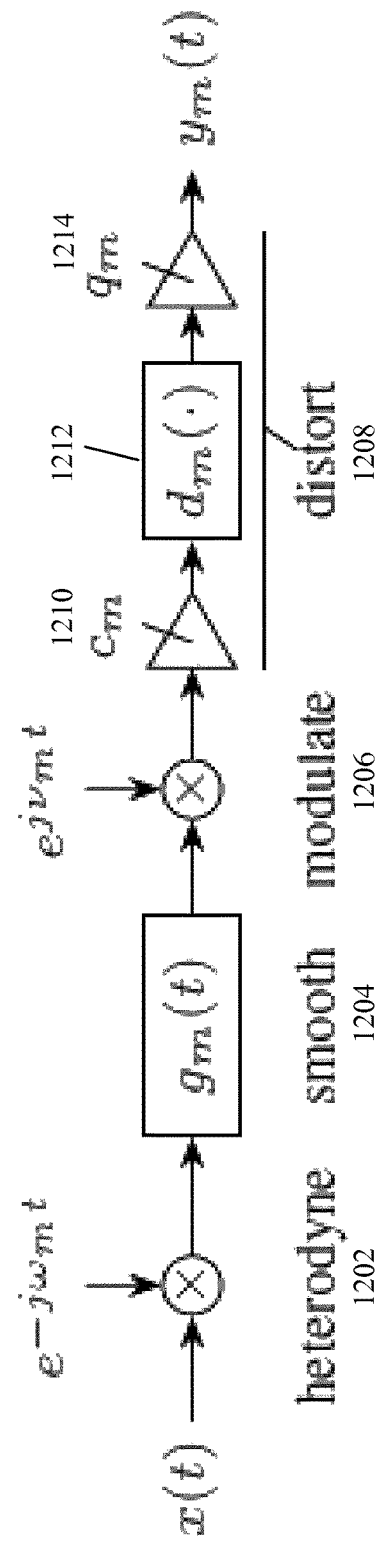
FIG. 12 is a block diagram of one mode of an example modal reverberator for performing distortion effect processing according to embodiments of the invention.

In one example implementation of these embodiments shown in FIG. 12, the modal reverberator architecture shown in FIG. 8 (or, alternatively, FIG. 1 or 2) is supplemented with a distortion process 1208 by distorting each mode response output before forming the final output $y_m(t)$.

For generality, the distortion process 1208 is shown as comprising a cascade of input conditioner 1210, distortion function 1212 and output conditioner 1214. However, not all these components may be needed in all embodiments. It should be noted that conditioners 1210 and 1214 may be inverses of each other. Examples of effects implemented by function 1212 include non-linear effects, distortion based on amplitude (e.g. saturation for loud signals and dead zones for quiet signals) and mode-dependent effects such as creating different numbers of harmonics based on frequency (e.g. higher numbers for lower frequencies, and lower numbers for higher frequencies). It should be further noted that distortion process 1208 can be designed together with the modulation process 1206 to make sure that no aliasing occurs.

Figure 13:
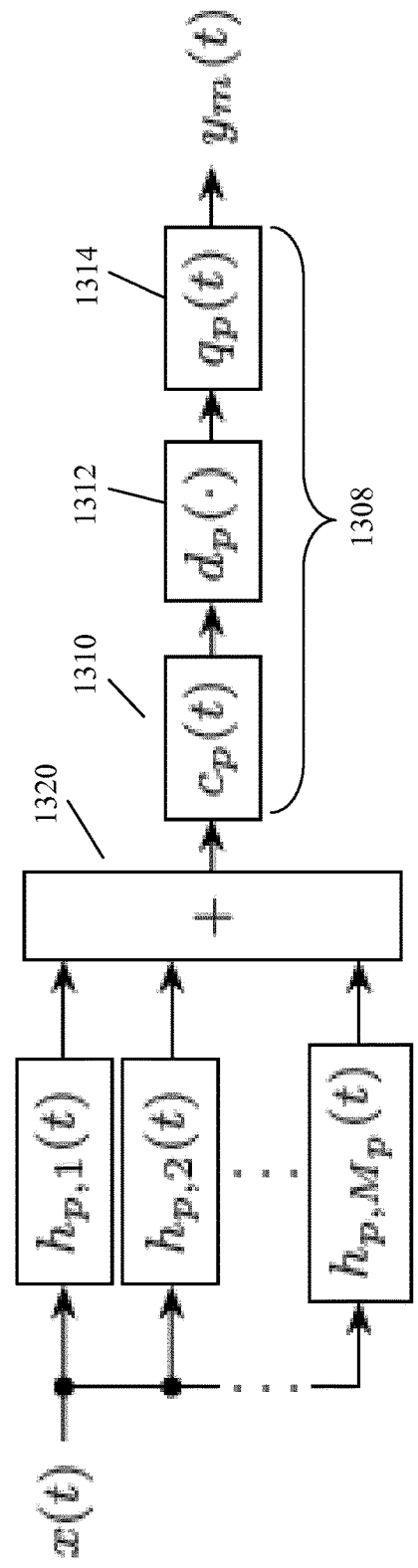
FIG. 13 is a block diagram of an example modal reverberator configured to perform distortion effect on a group of modes according to embodiments of the invention.

Alternatively to single modes as shown in FIG. 12, different groups p of $M_p$ modes each (the number $M_p$ of modes may be different for each group p) may have their outputs mixed first by mixer 1320 and then the combined outputs are distorted together in a single distortion process 1308, as shown in FIG. 13. It should be noted that the groups p may be formed of contiguous modes (e.g. a sub-band or octave), however this is not necessary in all embodiments (e.g. groups may comprise a single note in a number of different octaves). As shown, process 1308 includes input and output filters 1310 and 1314, with distortion function 1312.

With the modes individually distorted as shown in FIG. 12, or with the mode frequencies in a given group p in FIG. 13 having roughly harmonic relationships, the distortion produced will be free of intermodulation products. This distortion has a different sonic character than is typical, producing a distorted sound while maintaining the harmonic structure of the dry track. There are a number of pop songs, including "Something About You" by Boston (Boston, "Boston," LP, Aug. 25, 1976) and "God Save the Queen" by Queen (Queen, "A night at the opera," LP, Nov. 21, 1975), which use this type of effect with guitar, and presumably achieved by multitracking, building up chord sequences from single-note lines of music. (Such an effect could also be achieved using a hexaphonic pick-up, and having a separate distortion process on each string's output.) Modal distortion can be considered a further exaggeration of this method—rather than distorting individual notes, each mode in a signal may be distorted independently.

This process can also reduce the need for upsampling, as the distortion applied can be tailored to the frequency, for instance using pure sinusoids for the outputs of the distorted mode responses for frequencies above half the Nyquist limit.

An example distortion process is shown in FIGS. 14(A) and 14(B), with the guitar track used above distorted in the presence of both short and longer reverberation times. FIG. 14(A) is a spectrogram showing the guitar track processed with a modal distortion having a decay time of 200 ms and FIG. 14(B) is a spectrogram showing the guitar track processed with a modal distortion having a decay time of about 2 s.

Another alternative to the approach of FIGS. 12 and 13 is to substitute alternative periodic waveforms, for example sawtooth or wavetable-based waveforms, for the sinusoidal modulators 206 in the architecture of FIG. 2 or 8. Unlike the distortion from memoryless nonlinearities, this approach provides distortion that is independent of signal amplitude.

It should be noted that in all the above described distortion techniques, desired effects may be achieved with no computational latency. More particularly, the above techniques can use processing that computes on a sample-by-sample basis, whereas conventional processes for performing effects such as pitch shifting require processing over prolonged durations of signals and associated delays.

Figure 15:
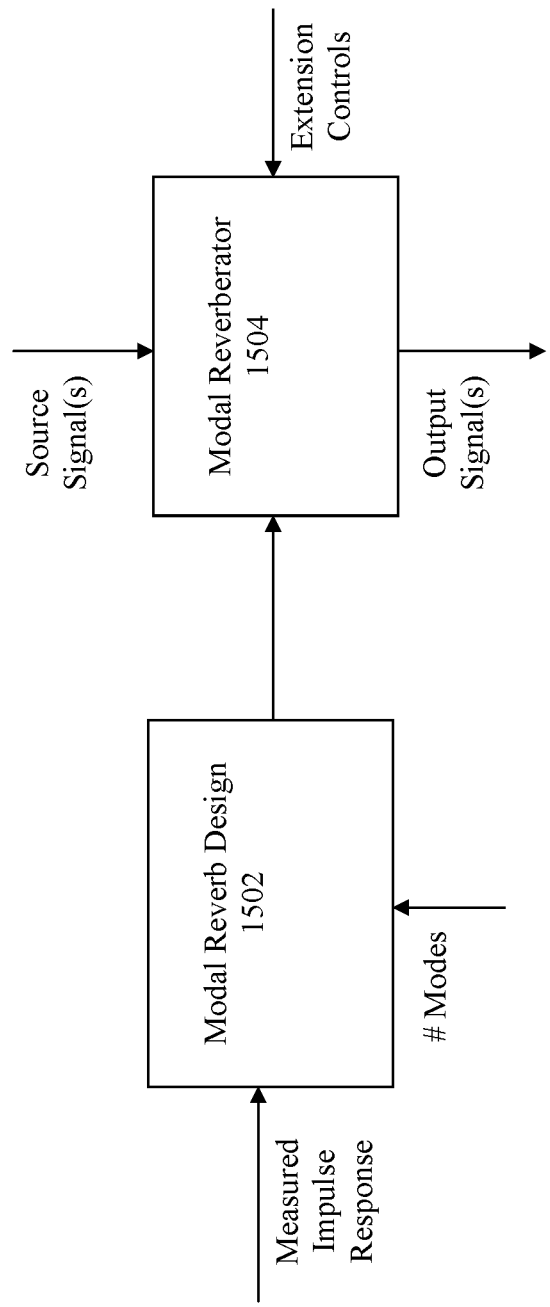
FIG. 15 is a block diagram illustrating an example implementation of a modal reverberator having audio effect processing in a digital audio workstation according to embodiments of the invention.

FIG. 15 is a block diagram illustrating an example system according to embodiments of the invention. In these and other embodiments, the system can be included in a sound editing application and implemented by a plug-in in a digital audio workstation (DAW).

As shown, the example system includes a design module 1502 and a modal reverberator module 1504. Design module 1502 receives a measured impulse response for a room or resonating object to be modeled. For example, the DAW can include a library of measured responses from which a desired response can be selected. As another example, the measured response can be directly obtained using techniques known to those skilled in the art. Using the measured response, module 1502 then generates the parameters for the modal reverberator, specifically the mode frequencies, dampings and amplitudes for each of the M filters $h_1(z)$ to $h_M(z)$ such as those shown in FIG. 1, using a behavioral technique as described in the co-pending application, for example. As shown, it is possible that the number of modes can be dynamically selected or generated, in addition to other possible design controls. For example, in addition to obtaining mode frequencies and decay times for each mode using the behavioral technique, virtual reality controls can include adapting the mode gains as a function of source and listener positions.

It should be apparent the design module 1502 can be implemented using any of the other example design methodologies described in the co-pending application, or combinations thereof. In all of these embodiments, however, the result of the processing of design module 1502 is a set of mode parameters that can be used to implement the artificial reverberation and effects techniques of the present invention.

Reverberator module 1504 effectively implements any or all of the reverberator structures described in connection with FIG. 4, 8, 12 or 13, all of which apply artificial reverberation to a source signal that yields an output signal, as further processed with effects as described in more detail above. In the example of FIG. 15, the modal reverberator module 1504 can be dynamically adjusted (e.g. mode parameters changed) to implement any of the techniques described above for imprinting a desired effect on the output signal.

It should be noted that design module 1502 and reverberator module 1504 are not necessarily included in the same system in all embodiments.

In one example implementation, either or both of module 1502 and 1504 in the system shown in FIG. 15 are included in a computer configured with DAW software such as Digidesign Pro Tools that supports plugin applications (e.g. AU, VST, RTAS compatible plugins), and possibly having a DSP card (not shown) that accelerates plugin processing. One possible example of a card and corresponding plugin application that can be adapted for use with this invention is UAD-1 DSP card and plugin bundle from Universal Audio of Santa Cruz, Calif. In such an example, the modal reverb techniques of the present invention are included as one plug-in application, or one application of among many plug-in applications provided with the card. In one example embodiment, the computer is a Mac or PC having a processor such as an Intel Pentium or other Intel CPU, AMD Athlon or other AMD CPU, or a Power-compatible CPU.

Audio (either provided within or to the system in real-time or via recorded media) can be processed by the DAW using the plug-in application and the techniques of the present invention. The plug-in application can further allow a user, via a user interface such as a graphical display, mouse, keyboard, etc., to select and adjust the parameters used by modules 1502 and 1504 (e.g. selecting desired impulse responses, number of modes, extension controls, etc.), which can further cause the DAW to process the audio with the desired effect. For example, after the processing of module 1502 has been performed to generate a set of artificial reverberation mode parameters for a given environment (e.g. a virtual reality room), module 1504 can be interacted with by a user to add any of the effects described in more detail above using user interface controls. For example, these user interactions can include varying gate times and possibly selecting bands for gated reverberation, varying a resampling of the smoothing filter used to implement time stretching effects, varying pitch shifting factors or techniques, and varying distortion added to each or groups of modes. Those skilled in the art will be able to understand how to implement the invention using software written in accordance with the methodologies described herein for use in a DAW after being taught by the present disclosure.

It should be noted that implementations of the invention apart from sound editing applications such as a DAW are possible. For example, the invention can be included in a live sound system or in embedded applications such as Karaoke systems. In such embedded applications where only a limited amount of memory available, only module 1504 can be included, perhaps along with a number of preset adjustments to mode parameters for respective desired effects.

Although the present invention has been particularly described with reference to the preferred embodiments thereof, it should be readily apparent to those of ordinary skill in the art that changes and modifications in the form and details may be made without departing from the spirit and scope of the invention. It is intended that the appended claims encompass such changes and modifications.

What is claimed is:
1. A method comprising:
 receiving a source signal;
 applying, by a processor, artificial reverberation to the source signal by processing the source signal in parallel using a plurality of mode filters;
 summing outputs of the plurality of mode filters to produce an artificially reverberated version of the source signal, wherein each of the mode filters is implemented as a cascade of separate heterodyning, smoothing and modulation functions and wherein the method further includes performing gated reverberation by adjusting the smoothing function, and wherein the heterodyning function comprises forming a baseband version of the source signal centered at the respective mode frequency of the each mode filter, and wherein the smoothing function comprises convolving the baseband version of the source signal with an exponential to form a smoothed version of the source signal; and causing the artificially reverberated version of the source signal to be rendered as an audio signal through a speaker.

2. A method according to claim 1, wherein the smoothing function is an exponential decay, and adjusting includes subtracting from its input a scaled and delayed version of the input.

3. A method according to claim 2, further comprising grouping a first plurality of modes together, grouping a second plurality of modes together, and using different delays for the first and second plurality of modes.

4. A method according to claim 1, wherein adjusting includes performing a truncated IIR technique.

5. A method according to claim 1, wherein adjusting includes cascading the smoothing function with itself a plurality of times.

6. A method according to claim 1, wherein applying artificial reverberation to the source signal is performed by the processing of the source signal using the plurality of mode filters.

7. A method according to claim 1, wherein none of the plurality of mode filters used to apply artificial reverberation to the source signal has an input coupled to the output of any other the other plurality of mode filters.

8. A method according to claim 1, wherein each of the plurality of mode filters processes a corresponding mode of the source signal, and wherein each of the plurality of mode filters implements a reverberation of the corresponding each mode independently of the other plurality of mode filters.

9. A method according to claim 1, wherein the gated reverberation is controlled so as to vary over time.

10. A method according to claim 1, wherein the gated reverberation performed by a first one of the plurality of mode filters is different from the gated reverberation performed by a second one of the mode filters.

11. A method comprising:
receiving a source signal;
applying, by a processor, artificial reverberation to the source signal by processing the source signal in parallel using a plurality of mode filters;
summing outputs of the plurality of mode filters to produce an artificially reverberated version of the source signal,
wherein each of the mode filters is implemented as a cascade of separate heterodyning, smoothing and modulation functions and wherein the method further includes performing time stretching by performing a resampling of the smoothing function output, and
wherein the heterodyning function comprises forming a baseband version of the source signal centered at the respective mode frequency of the each mode filter, and
wherein the smoothing function comprises convolving the baseband version of the source signal with an exponential to form a smoothed version of the source signal; and causing the artificially reverberated version of the source signal to be rendered as an audio signal through a speaker.

12. A method according to claim 11, wherein the smoothing function output is sampled at an original system sampling frequency, and wherein the resampling includes sampling the smoothing function output at a sampling frequency that is different than the original system sampling frequency.

13. A method according to claim 11, wherein the time stretching is controlled so as to vary over time.

14. A method according to claim 11, wherein the time stretching performed by a first one of the plurality of mode filters is different from the time stretching performed by a second one of the mode filters.

15. A method comprising:
receiving a source signal;
applying, by a processor, artificial reverberation to the source signal by processing the source signal in parallel using a plurality of mode filters;
summing outputs of the plurality of mode filters to produce an artificially reverberated version of the source signal,
wherein each of the mode filters is implemented as a cascade of separate heterodyning, smoothing and modulation functions and wherein the method further includes performing pitch shifting by using different frequencies for the heterodyning and modulation functions, and
wherein the heterodyning function comprises forming a baseband version of the source signal centered at the respective mode frequency of the each mode filter, and
wherein the smoothing function comprises convolving the baseband version of the source signal with an exponential to form a smoothed version of the source signal; and
causing the artificially reverberated version of the source signal to be rendered as an audio signal through a speaker.

16. A method according to claim 15, wherein a modulation frequency is shifted by an integer multiple of 1/12 of an octave from a heterodyning frequency.

17. A method according to claim 15, wherein the pitch distortion is controlled so as to vary over time.

18. A method according to claim 15, wherein the pitch shifting performed by a first one of the plurality of mode filters is different from the pitch shifting performed by a second one of the mode filters.

19. A method comprising:
receiving a source signal;
applying, by a processor, artificial reverberation to the source signal by processing the source signal in parallel using a plurality of mode filters for a corresponding plurality of different modes;
applying at least two different distortion processes in addition to the artificial reverberation, wherein the at least two different distortion processes are respectively performed on at least two different ones of the plurality of modes;
summing outputs of the plurality of mode filters to produce an artificially reverberated version of the source signal,
wherein each of the mode filters is implemented as a cascade of separate heterodyning, smoothing and modulation functions, and
wherein the heterodyning function comprises forming a baseband version of the source signal centered at the respective mode frequency of the each mode filter, and wherein the smoothing function comprises convolving the baseband version of the source signal with an exponential to form a smoothed version of the source signal; and causing the artificially reverberated version of the source signal to be rendered as an audio signal through a speaker.

20. A method according to claim 19, wherein applying the distortion process includes further performing a distortion function on each mode.

21. A method according to claim 20, wherein the distortion function is mode dependent.

22. A method according to claim 19, wherein applying the distortion process further includes combining outputs of a group of the plurality of mode filters, and performing a distortion function on the combined outputs.

23. A method according to claim 19, wherein the distortion process is non-linear.

24. A method according to claim 19, wherein the distortion is controlled so as to vary over time.

25. A method according to claim 19, wherein the modulation function comprises modulating the smoothed version of the source signal back to the respective mode frequency of the each mode filter.

26. A method comprising:

receiving a source signal;

applying, by a processor, artificial reverberation to the source signal by processing the source signal in parallel using a plurality of mode filters respectively corresponding to a plurality of modes;

summing outputs of the plurality of mode filters to produce an artificially reverberated version of the source signal, wherein each of the mode filters implements a reverberation effect on the corresponding mode independently of the other modes, and wherein each of the mode filters is implemented as a cascade of separate heterodyning, smoothing and modulation functions, and wherein the heterodyning function comprises forming a baseband version of the source signal centered at the respective mode frequency of the each mode filter, and wherein the smoothing function comprises convolving the baseband version of the source signal with an exponential to form a smoothed version of the source signal; and causing the artificially reverberated version of the source signal to be rendered as an audio signal through a speaker.

27. A method according to claim 26, wherein the reverberation effect is a gated reverberation.

28. A method according to claim 26, wherein the reverberation effect is a two-stage decay.

29. A method according to claim 26, wherein the mode filter comprises a phasor filter.

30. A method according to claim 26, wherein the mode filter comprises a first-order complex filter.

31. A method according to claim 26, wherein the reverberation effect is an iterated reverberation.

* * * * *